US005923408A

United States Patent [19]
Takabayashi

[11] Patent Number: 5,923,408
[45] Date of Patent: *Jul. 13, 1999

[54] SUBSTRATE HOLDING SYSTEM AND EXPOSURE APPARATUS USING THE SAME

[75] Inventor: Yukio Takabayashi, Utsunomiya, Japan

[73] Assignee: Canon Kabushiki Kaisha, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/788,828

[22] Filed: Jan. 27, 1997

[30] Foreign Application Priority Data

Jan. 31, 1996 [JP] Japan ................................ 8-035832

[51] Int. Cl.⁶ ............................. G03B 27/42; G03B 27/60
[52] U.S. Cl. .............................. 355/53; 355/73; 269/21
[58] Field of Search ................................. 355/43–45, 53, 355/75, 76, 77, 73; 269/21, 286, 287; 250/548

[56] References Cited

U.S. PATENT DOCUMENTS

| 4,522,489 | 6/1985 | Bouwer | ........................................ 355/53 |
|---|---|---|---|
| 5,324,012 | 6/1994 | Aoyami et al. | ............................ 269/21 |
| 5,374,829 | 12/1994 | Sakamoto et al. | ......................... 269/21 |
| 5,563,683 | 10/1996 | Kamiya | ....................................... 355/53 |

FOREIGN PATENT DOCUMENTS

| 1-214042 | 8/1989 | Japan . | |
| 4-152512 | 5/1992 | Japan | ...................................... 355/76 |

*Primary Examiner*—D. Rutledge
*Attorney, Agent, or Firm*—Fitzpatrick, Cella, Harper & Scinto

[57] ABSTRACT

A substrate holding system for holding a substrate by attraction through a negative pressure, has protrusions for supporting the substrate, including a primary protrusion of annular shape disposed around a substrate lifting pin and secondary protrusions distributed around the primary protrusions, and an arrangement for reducing a local change in shape of the substrate in a portion around the primary protrusion as the substrate is attracted by the negative pressure.

25 Claims, 13 Drawing Sheets

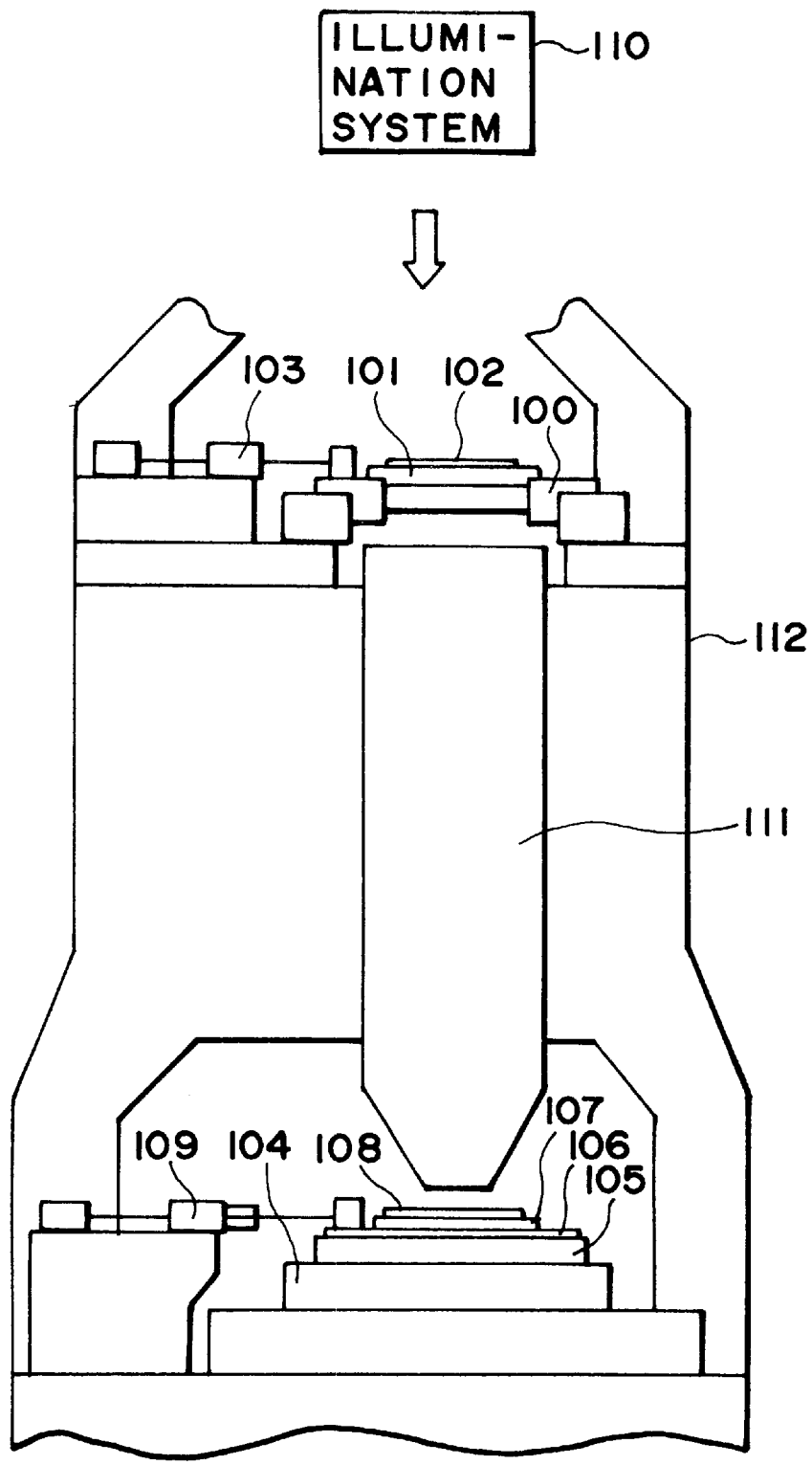
F I G. 1

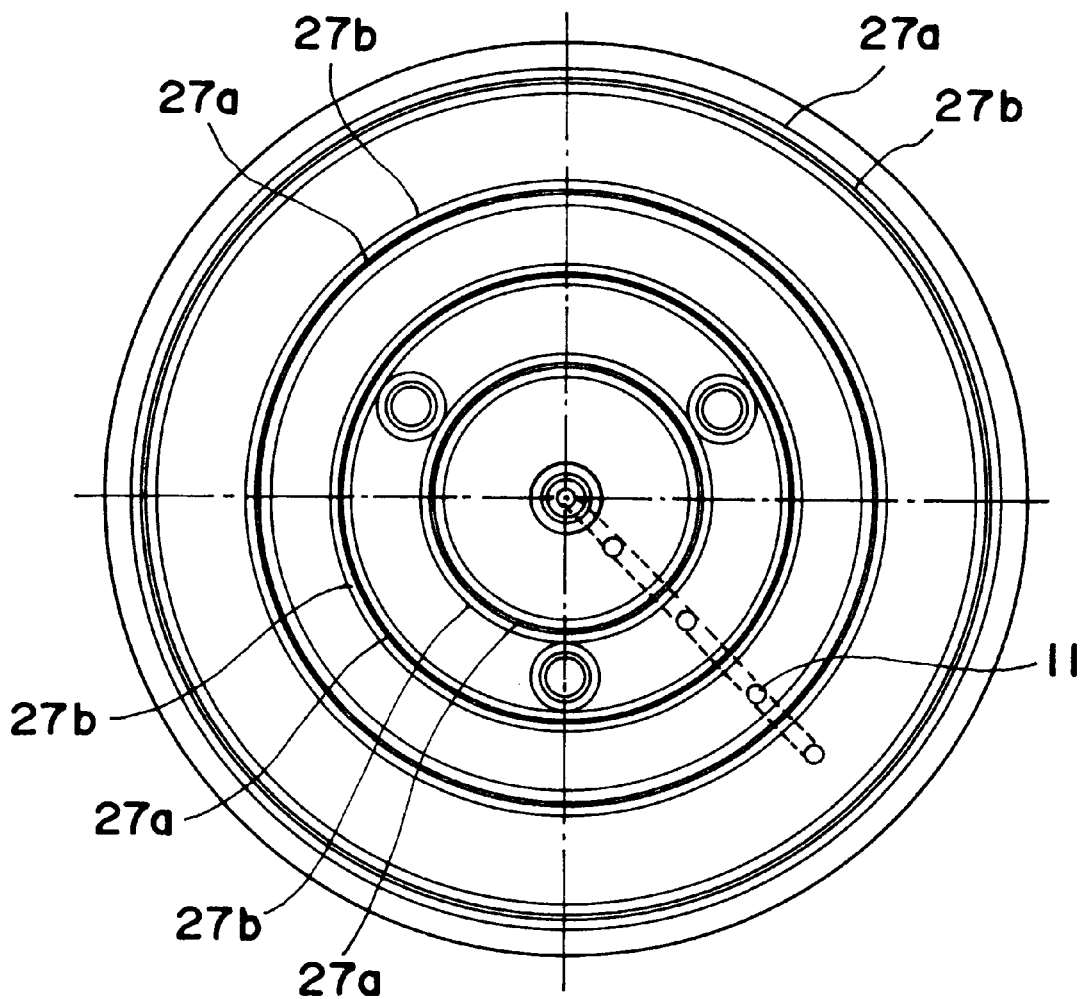
F I G. 11

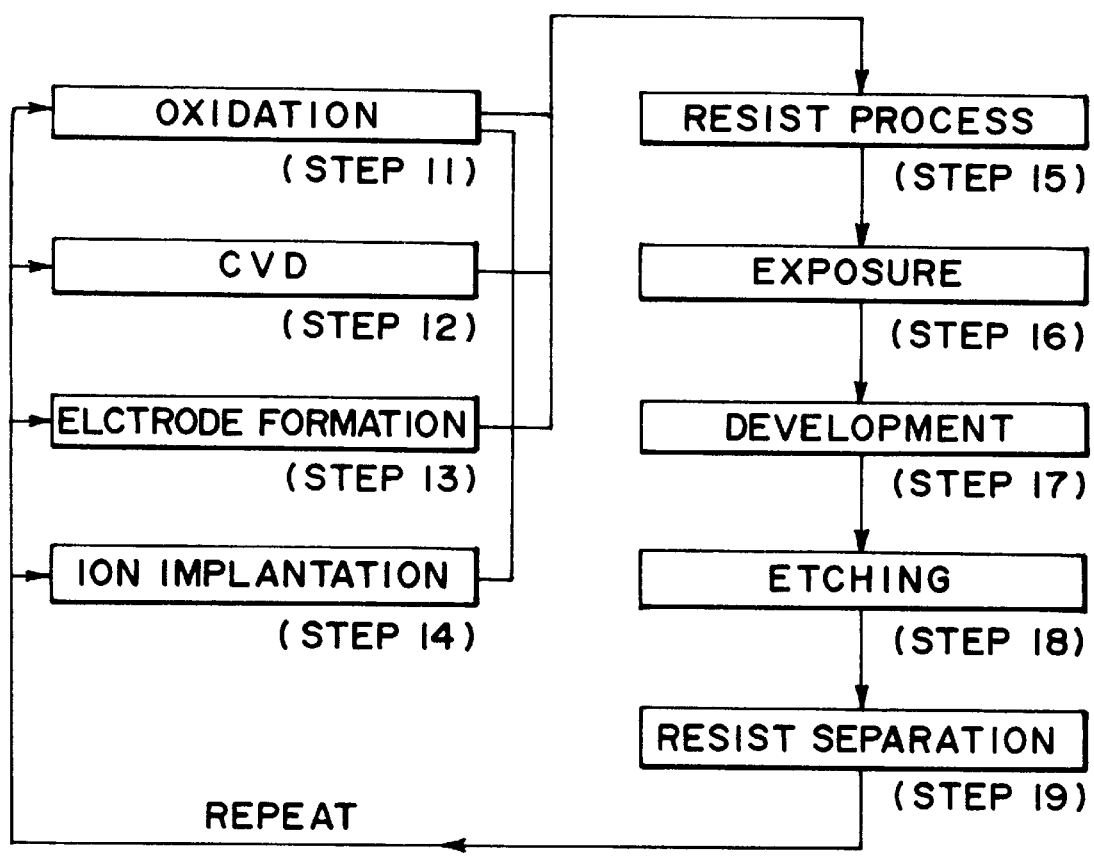
F I G. 13

SUBSTRATE HOLDING SYSTEM AND EXPOSURE APPARATUS USING THE SAME

FIELD OF THE INVENTION AND RELATED ART

This invention relates to a substrate holding system for a substrate such as a liquid crystal substrate or a semiconductor wafer in the manufacture of semiconductor devices, for holding such a substrate by attraction while preventing a shift or warp during an exposure process. In another aspect, the invention is concerned with an exposure apparatus or device manufacturing method which uses such a substrate holding system.

Generally, a projection exposure apparatus for the manufacture of semiconductor devices or liquid crystal display devices uses a substrate attracting and holding system for holding a substrate (workpiece) fixedly and for correcting any warp to keep flatness, by means of a vacuum attraction force. FIG. 14 is a sectional view of a known type of substrate attracting and holding system. As shown in the drawing, this substrate attracting and holding system has a wafer chuck (carrying table) 8 which is provided with a carrying surface 2 for carrying thereon a substrate 1, three throughbores 3 (3a–3c) extending from the carrying surface 2 to the bottom, first flanges 4 (4a–4c) formed on the carrying surface and around the throughbores 3, respectively, a second flange 5 formed at the circumference of the carrying surface 2, and protrusions formed on the carrying surface 2 between the first and second flanges 4 and 5 and for supporting the substrate 1 placed thereon. The system further includes three lift pins 9 (9a–9c) disposed inside the throughbores 3, respectively, for transfer of the wafer 1, a vertical motion mechanism 10 for moving the lift pins 9 upwardly and downwardly, and a wafer chuck support 12 for supporting the wafer chuck 8. Also, there is a vacuum piping system 11 for depressurizing the space which is defined by the substrate 1 placed, the carrying surface 2, the first and second flanges 4 and 5, and the protrusions 6, to thereby attract and hold the substrate 1 to and upon the carrying surface 2.

In the structure described, a wafer (workpiece) 1 is moved by a conveying hand of an external conveying system (not shown) onto the lift pins 9, being kept in their positions protruded out of the carrying surface 2. As the conveying hand is retracted, the vertical motion mechanism 10 promptly moves the lift pins 9 downwardly so that the wafer is transferred onto the wafer chuck 8. Here, just before or just after the wafer 1 contacts the wafer chuck 8, the substrate attracting and holding system starts a vacuum attraction through the vacuum piping system 11. Thus, the wafer 1 is held fixed, while being attracted to the carrying surface 2, whereby flatness correction is carried out. In this state, a semiconductor exposure apparatus operates to perform lithographic pattern transfer. After it, the above described operations are carried out in reversed order, whereby the wafer 1 is unloaded from the substrate attracting and holding system.

FIG. 15 is a top plane-view, showing the first and second flanges 4 and 5 and protrusions 6, on the carrying surface 2, of the structure of FIG. 14.

The first flanges 4 are formed in an annular shape around the throughbores 3a–3c, respectively. The second flange is formed in an annular shape at the circumference of the carrying surface 2. Thus, when the wafer 1 is to be attracted by vacuum, they function to provide a shield to the atmosphere, to secure a vacuum space. The protrusions 6 are provided on the carrying surface 2, between the first and second flanges 4 and 5, so as to reduce the coefficient of contact between the carrying surface and the bottom face of the wafer 1. The protrusions 6 are formed with a pin-like shape, and they are distributed into a grid-like pattern with a regular pitch.

In a lithographic process, which is one of the semiconductor manufacturing processes, wherein a fine pattern is lithographically transferred onto a substrate, the depth of focus has been decreased in accordance with miniaturization of the device. Currently, it is about 1 micron. Taking the process margin of the device manufacture into account, as regards the flatness-correction of a wafer upon a wafer chuck, the wafer has to be flattened into a flatness of about ⅕ of the depth of focus.

However, in the substrate attracting and holding system of the type described above, the throughbores 3a–3c for the lift pins do not serve as a vacuum space and, therefore, a flatness-correcting force by attraction does not apply to the wafer portions above the throughbores 3a–3c. As a result, the flatness of the wafer portions above the throughbores 3a–3c is directly influenced by the flatness of those vacuum-attracted portions around them. It is empirically known that, at a portion like a throughbore portion, the attracted wafer may swell locally. Also, at a wafer peripheral portion, there may be warping. Such local swelling may disturb the accomplishment of a desired flatness and, on the other hand, it may cause distortion of that portion of the wafer in the plane direction, thus expanding distortion of an image to be printed.

The swelling or warping attributes to flexure of a protruded portion of the chuck due to the compressive force applied thereto during the vacuum attraction. Particularly, if there occurs a difference in flexure quantity between a protruded portion and a flange portion juxtaposed therewith, then, as shown in FIG. 16, which is a sectional view showing a lift-pin throughbore 3 portion, the wafer is locally distorted, and swelling or warping results.

Recently, the contact area between a chuck and a wafer has been decreased in an attempt to reduce the probability of catching foreign particles between the chuck and the wafer. Thus, each protrusion is being sharpened. On the other hand, when a vacuum attraction chuck is used in a semiconductor manufacturing apparatus, the time to completion of the substrate attraction has to be shortened, in $\frac{1}{100}$ second order. To this end and in order to secure a sufficient evacuation rate during vacuum attraction and to reduce evacuation resistance, it is necessary to keep a large gap between the wafer and the chuck bottom, that is, a large height of the protrusion. This makes the lateral-to-longitudinal ratio of the protrusion larger, and also it makes the compressive-force flexure larger. As a result, local distortion of a wafer such as shown in FIG. 16 becomes more outstanding.

SUMMARY OF THE INVENTION

It is an object of the present invention to provide a substrate holding system by which any local change in shape of a substrate as the same is held by attraction can be reduced.

It is another object of the present invention to provide an exposure apparatus or a device manufacturing method for the manufacture of high precision devices, using such a substrate holding system.

In accordance with an aspect of the present invention, there is provided a substrate holding system for holding a substrate by attraction through a negative pressure, comprising: protrusions for supporting the substrate, including a primary protrusion of annular shape disposed around a substrate lifting pin and secondary protrusions distributed around said primary protrusions; and means for reducing a local change in shape of the substrate in a portion around said primary protrusion as the substrate is attracted by the negative pressure.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 1 is a sectional view, showing a general structure of an exposure apparatus including a wafer chuck.

FIG. 11 is a top plan view of a further modified form of a wafer chuck.

FIG. 13 is a flow chart of a wafer process.

DESCRIPTION OF THE PREFERRED EMBODIMENTS

Figure 2:
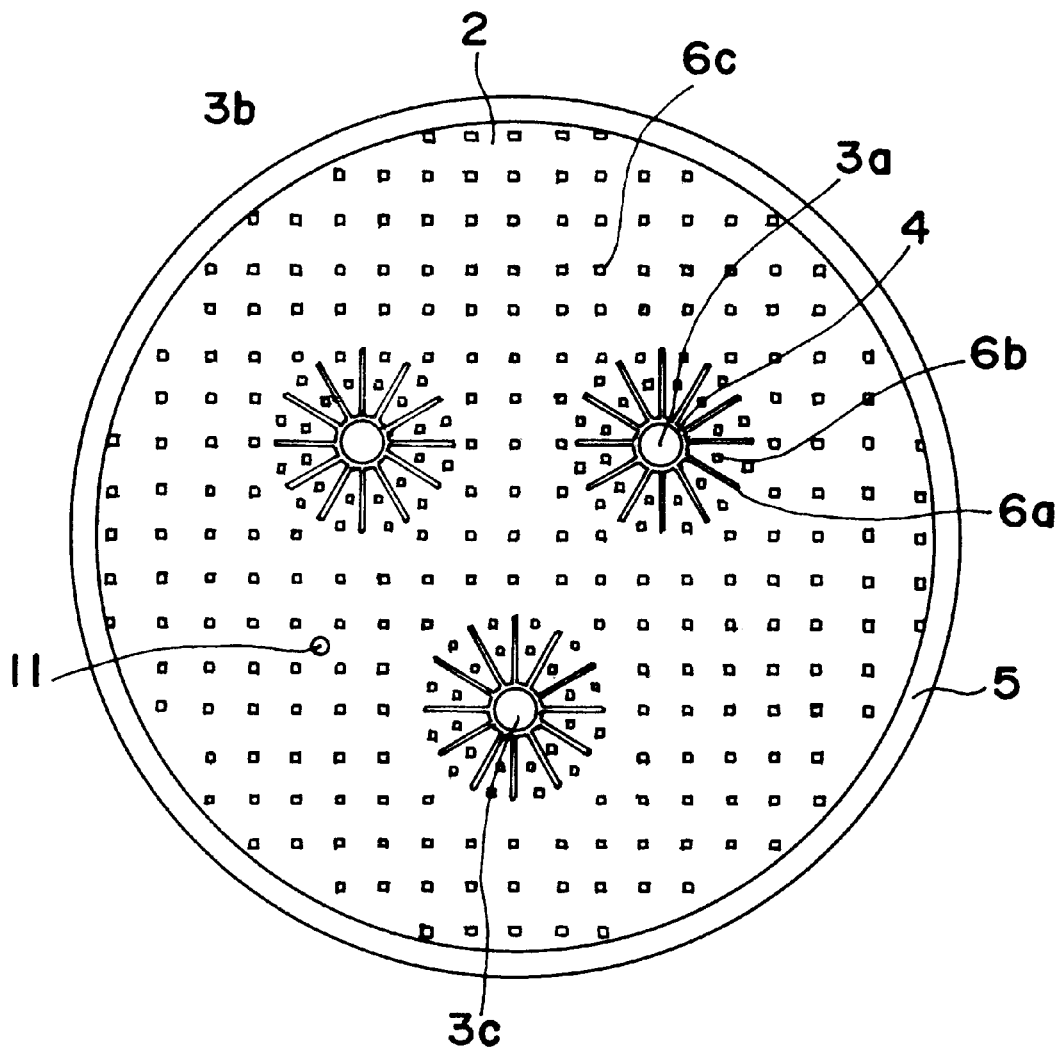
FIG. 2 is a top plan view of a wafer chuck in accordance with an embodiment of the present invention.

Some preferred embodiments of the present invention will be described in conjunction with the drawings. FIG. 1 shows a general structure of an exposure apparatus. Denoted in FIG. 1 at 100 is a reticle stage, and it has a reticle chuck 101 for holding a reticle 102. The reticle stage 100 is scanningly movable in one direction (X direction). There is a laser interferometer 103 for monitoring movement of the reticle stage. A wafer stage is provided on a base table 104, and it has a Y stage 105 and an X stage 106. It includes a wafer chuck (substrate holding mechanism) 107 for holding a wafer 108. Details of this wafer chuck 107 will be described later. The wafer stage is movable in two directions (X and Y directions). There is a laser interferometer 109 for monitoring movement of the wafer stage. Denoted at 110 is illumination means including a light source and an illumination optical system, and it serves to illuminate the reticle 102 with slit light which is elongated in a direction (Y direction) perpendicular to the scan direction of the reticle stage. Denoted at 111 is a reduction projection optical system for projecting a pattern of the reticle 102 onto the wafer 108 in a reduced scale of 4:1. Denoted at 112 is a frame for holding the reticle stage 100, the wafer stage 104, and the reduction projection optical system 111. With this structure, the pattern of the reticle can be transferred to different zones on the wafer, successively.

Figure 3:
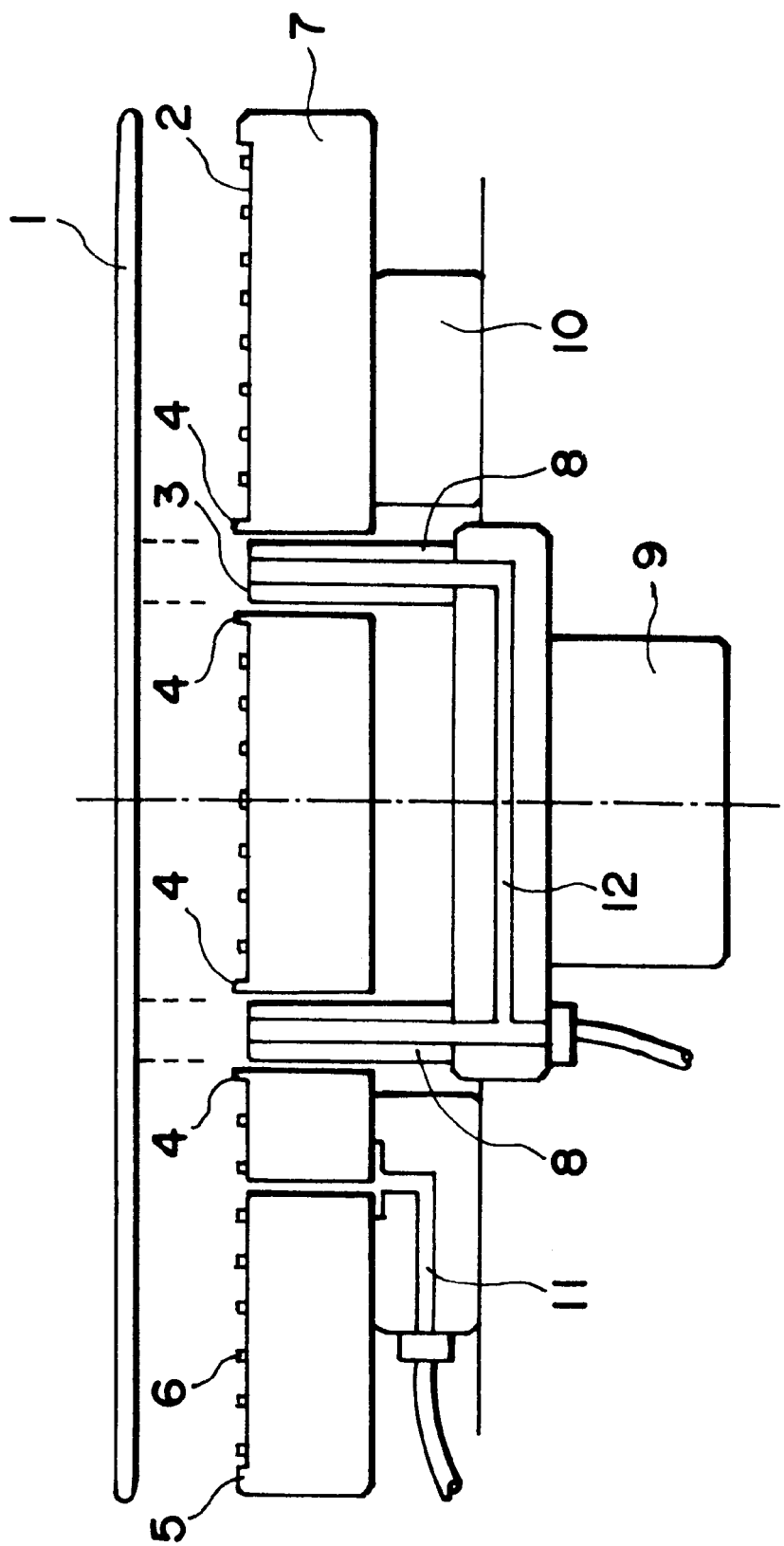
FIG. 3 is an enlarged sectional view of the wafer chuck of FIG. 2.
Figure 4:
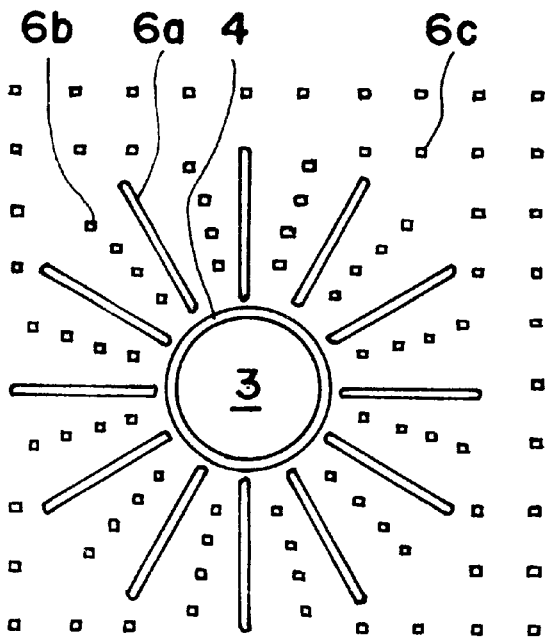
FIG. 4 is an enlarged view of a portion of the wafer chuck of FIG. 2, around a throughbore.

FIG. 2 is a top plan view of the wafer chuck 107, and FIG. 3 is a sectional view thereof. FIG. 4 is an enlarged view, showing a portion around a throughbore illustrated in FIG. 2. As shown in these drawings, the wafer chuck includes a carrying table which has a carrying surface 2 for carrying a wafer 1 thereon, throughbores 3 (3a–3c) extending from the carrying surface 2 to the bottom, and first flanges 4 provided by annular protrusions formed on the carrying surface around the throughbores 3, respectively. The carrying table further comprises a second flange 5 provided by a protruded rim formed at a circumference (outside periphery) of the carrying surface 2, and protrusions 6 formed on the carrying surface 2 between the first and second flanges and for supporting the wafer 1 placed thereon. When the wafer 1 is placed on the chuck, a space is defined by the wafer 1, the carrying surface 2, the first and second flanges 4 and 5 and the protrusions 6. By depressurizing the space, the wafer 1 is attracted and held on the carrying surface 2. The protrusions 6 include linear protrusions 6a extending radially outwardly from a corresponding first flange 4, dot-like protrusions 6b disposed in the neighborhood of linear protrusions 6a with relatively high density, and protrusions 6c distributed in a grid-like fashion with regular spacings. Thus, the protrusions 6 so serve that the support rigidity per unit area as a wafer is held by attraction reduces gradually in a radial direction from the first flange 4. The three throughbores 3 (3a–3c) are those through which lift pins 8 move upwardly and downwardly. Each flange 4 is formed continuously along the circumference of a corresponding throughbore 3 so as to secure a closed space upon the carrying surface 2 during vacuum attraction. The shape of the flange 4 is not limited to an annular shape. It may be a polygonal ring. This applies to other examples to be described later.

The protrusions 6a have a linear shape and, with respect to a diameter D of the throughbore 3, have a length 1D in a radial direction from the bore and a width of 0.07–0.3 mm. The length is not limited to this. Preferably, it may be in a range of 0.5D–2.5D. The width of the protrusion 6a may preferably be as small as possible. The spacing between adjacent protrusions 6a may be about 1 mm, at the closest portion. The protrusions 6b are disposed between adjacent protrusions 6a at a pitch 1 mm or less. Each comprises a pin-like member of a diameter 0.1–0.5 mm. These protrusions 6a and 6b are disposed in a region from the first flange 4 to a distance 0.5–2.5 times the diameter of the throughbore 3, so that the supporting density per unit area, that is, the support rigidity, decreases gradually with the distance from the first flange 4. Provided that gradual reduction of support rigidity in accordance with the distance from the first flange 4 is assured, the structure of the protrusions 6a and 6b is not limited to the described one. They may be disposed at random or along an annular ring. Pin-like protrusions 6b may have different diameters, varying with specific intention.

The protrusions 6c comprise a number of pin-like members distributed in a grid-like fashion with a pitch of 2–3 mm, in a region on the carrying surface 2 spaced away from the throughbores 3. The second flange 5 is formed continuously along the outermost circumference of the carrying surface 2. It cooperates with the first flanges 4 to secure a closed space upon the carrying surface 2 during vacuum attraction.

The system further comprises three lift pins 8 (8a–8c) disposed along the throughbores 3, respectively, for wafer 1 transfer operation, and a vertical motion mechanism 9 for moving the lift pins 8 upwardly and downwardly. The system further comprises a wafer chuck support 10 for supporting the wafer chuck 7, and a vacuum piping system 11 for depressurizing the space as defined by the substrate 1, as placed on the chuck, the carrying surface 2, the first and second flanges 4 and 5 and the protrusions 6, to thereby attract and hold the substrate 1 on the carrying surface 2. There is another vacuum piping system 12 for supplying a vacuum, for wafer holding with lift pins, to small openings at free ends of the lift pins 8.

With this structure, a wafer 1 is loaded by a conveying hand of an external conveying mechanism (not shown) onto the three lift pins 8, as they protrude above the carrying surface 2. The wafer is attracted by small openings at the free ends of the lift pins, and it is held thereby. As the conveying hand is retracted, the vertical motion mechanism 9 promptly moves the lift pins 8 downwardly, such that the wafer 1 is transferred onto the wafer chuck 7. Here, just before or just after the wafer 1 contacts the wafer chuck 7, the substrate attracting and holding system starts a vacuum attraction through the vacuum piping system 11. Thus, the wafer 1 is attracted and held fixed while being supported by the protrusions on the carrying surface 2, and the flatness correction is performed.

Here, as the wafer is held by attraction, the load applied to the wafer surface is very large. It is about 3000N for an 8-inch wafer. Such a large load is supported by the protrusions 6 and the first and second flanges 4 and 5, contacting with a small contact area.

The protrusions 6 contract due to a compressive force applied to them by the vacuum attraction. In the present embodiment, in the region from the first flange 4 to a distance 0.5–2.5 times the diameter of the throughbore 3, due to the provision of the protrusions 6a and 6b, the support rigidity per unit area gradually decreases with the distance from the first flange 4. Thus, there is no interruption in the rigidity difference, and the rigidity varies slowly. Because of this structure, any swelling of a wafer portion above a central portion of the throughbores 3a– 3c, due to creation of a wafer surface level differences can be removed.

In this manner, the wafer 1 is held on the substrate attracting and holding system and high precision flatness thereof is assured. Then, an exposure process is performed to it by a semiconductor exposure apparatus. After the exposure process is completed, the above-described operations are performed in reversed order, whereby the wafer 1 is unloaded from the substrate attracting and holding system.

Figure 5:
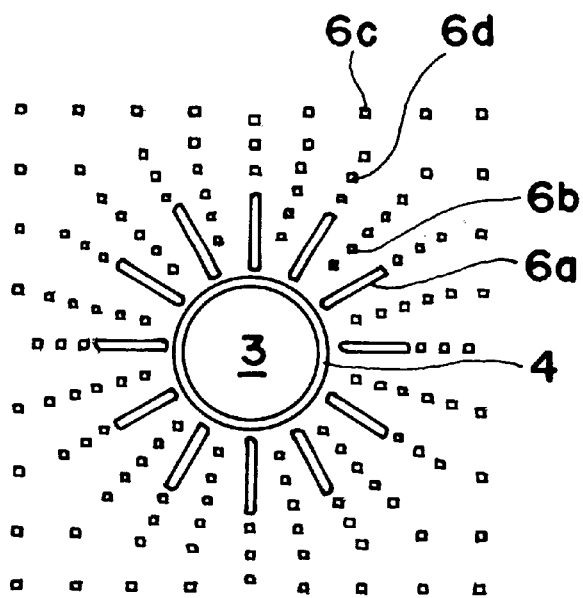
FIG. 5 is an enlarged view, similar to FIG. 4, showing a modified form of a wafer chuck.

FIG. 5 is an enlarged view of a portion of a modified form of a wafer chuck, of a substrate attracting and holding system of the present invention. As illustrated, outermost portions of linear protrusions 6a may be replaced by pin-like protrusions 6d. This is effective to reduce the coefficient of contact between the wafer and the protrusion 6d portion.

Figure 6:
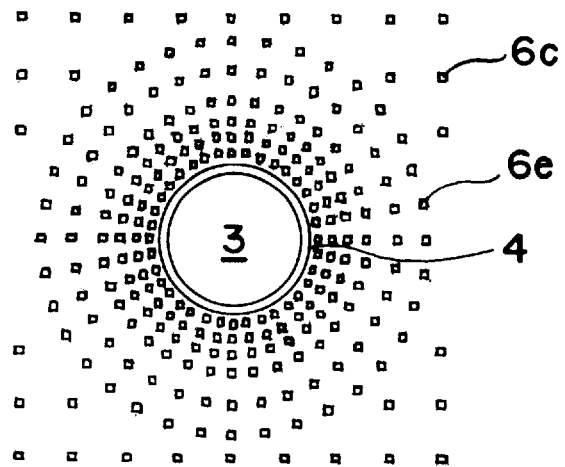
FIG. 6 is an enlarged view, similar to Figure 4, showing a further modified form of a wafer chuck.

FIG. 6 shows a portion of a further modified form of a wafer chuck, of a substrate attracting and holding system of the present invention. As illustrated, all the protrusions 6 may be provided by pin-like protrusions 6c and 6e. The protrusions 6e are so disposed that the placement pitch decreases along a direction toward the first flange 4, such that the density of the protrusions becomes higher as the distance to the first flange 4 decreases. In the outside portion, they are at the same pitch as the protrusions 6c, which are disposed like a grid.

Figure 7:
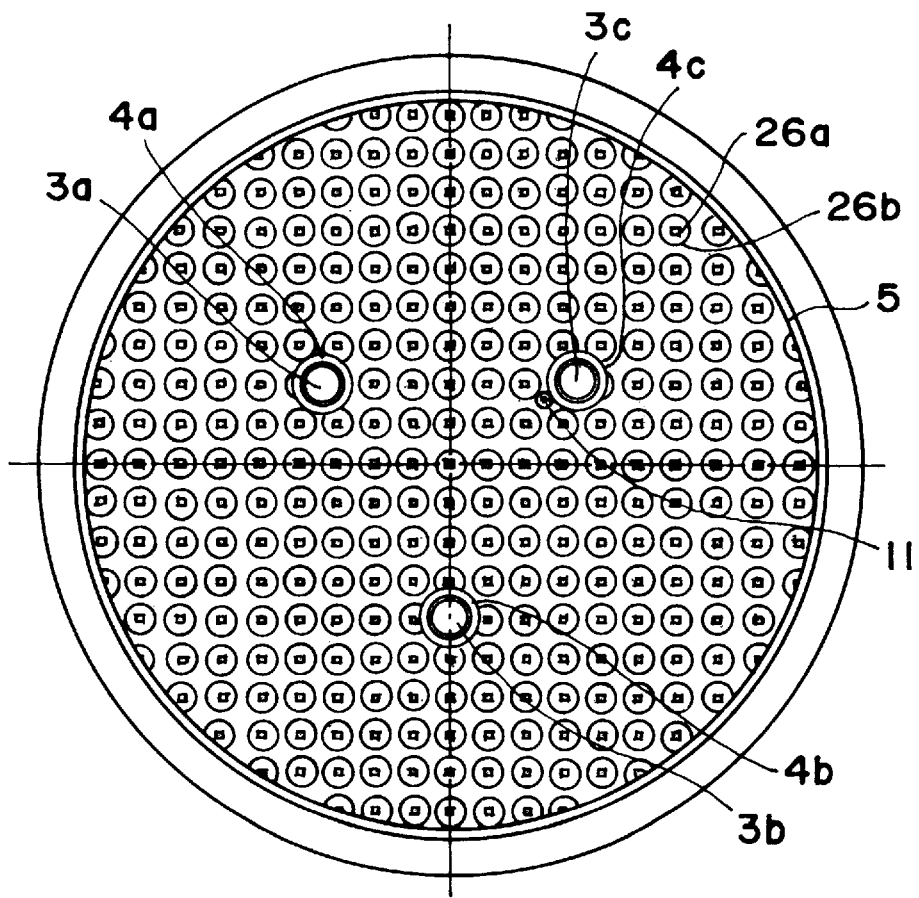
FIG. 7 is a top plan view of a wafer chuck according to another embodiment of the present invention.
Figure 8:
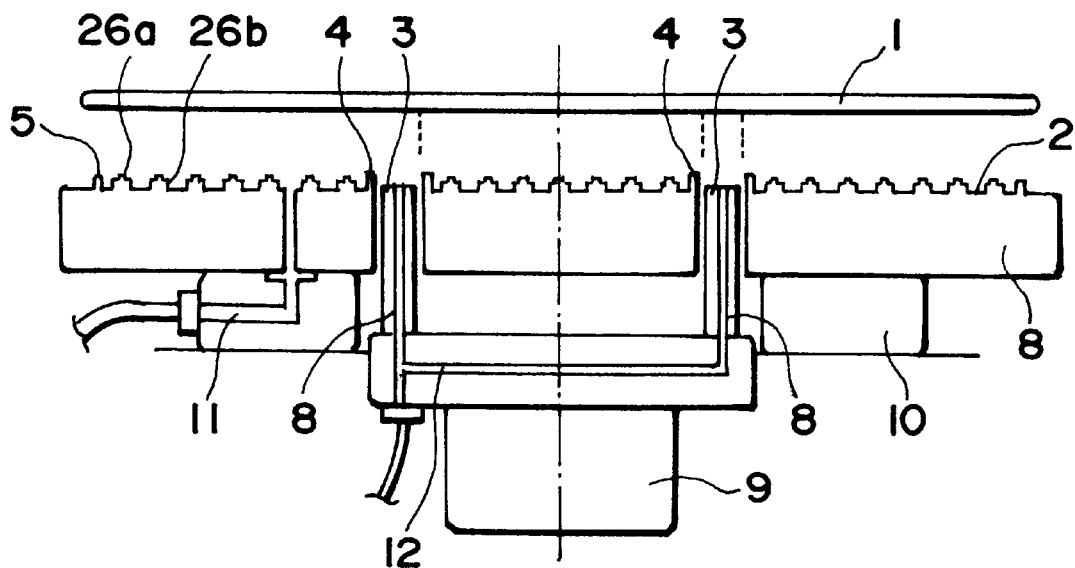
FIG. 8 is a sectional view of the wafer chuck of FIG. 7.
Figure 9:
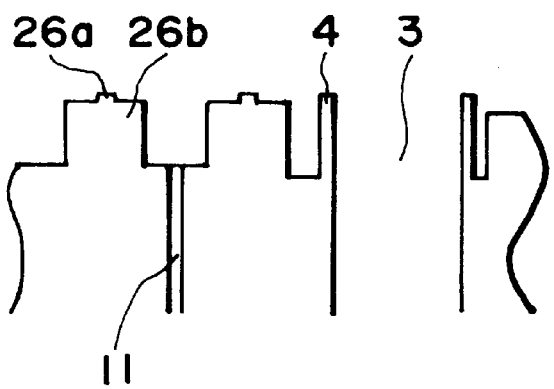
FIG. 9 is a schematic view for explaining details of protrusions around a throughbore.

FIG. 7 is a top plan view of a wafer chuck of a substrate attracting and holding system according to another embodiment of the present invention. FIG. 8 is a sectional view of this system. FIG. 9 is a schematic and sectional view of a portion about a throughbore of FIG. 8. Like numerals as those of the preceding embodiment are assigned to corresponding elements. This substrate attracting and holding system may be provided on an X-Y stage of a semiconductor exposure apparatus such as shown in FIG. 1.

The substrate attracting and holding system is provided with a carrying surface 2 for carrying a wafer 1 thereon, throughbores 3 (3a–3c) extending from the carrying surface to the bottom, first flange 4 (4a–4c) of annular protrusions formed on the carrying surface around the throughbores 3, respectively, and a second flange 5 of a protruded rim formed at the circumference (outside periphery) of the carrying surface 2. There are a number of protrusions which include first protrusions (small protrusions) 26a, to be brought into contact with the wafer 1 to be placed to support the same, and second protrusions 26b for supporting the first protrusions. They are distributed on the carrying surface 2, between the first and second flanges 4 and 5. The carrying table has the structure described above. As the wafer 1 is placed on the table, a closed space is defined by the wafer 1, the carrying surface 2, the first and second flanges 4 and 5, and the first and second protrusions 26a and 26b. By depressurizing this space through openings formed in the carrying surface and being communicated with a vacuum source, the wafer 1 is attracted and held by the table, while being supported by the protrusions on the carrying surface 2.

Details of the protrusions will be explained with reference to FIG. 9.

The first protrusions 26a to be brought into direct contact with a substrate comprise pin members of column-like shape, having a diameter of about 0.1 mm and a height of about 0.05 mm. As regards the height, a height larger than the size of a foreign particle may be sufficient. If the system is used in a super clean room with a very small possibility of presence of foreign particles, the height may be about 3 microns. Further, it is not necessary that the first protrusions 26a be formed of the same material as the chuck. They may be formed of a metal thin film, a glass thin film, or a ceramic-thin film, for example. As regards the shape of the first protrusions 26a, a conical shape, a polygonal-rod shape, a pyramid shape or a semi-spherical shape may be used, other than the column-like shape. If any shape is used, all the surfaces to be brought into contact with a wafer may be lapped into the same plane.

Figure 10:
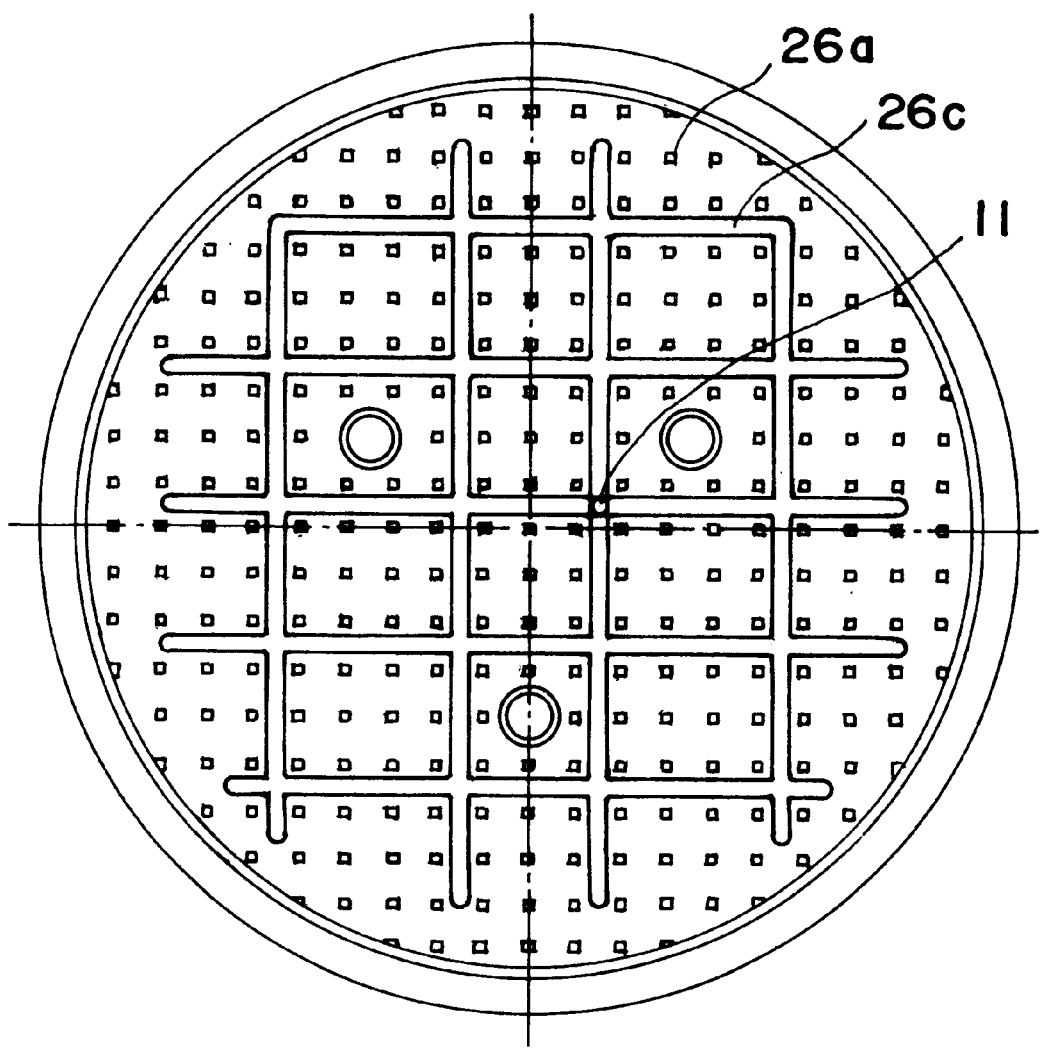
FIG. 10 is a top plan view of a modified form of a wafer chuck.

The second protrusions 26b are formed below the first protrusions and they have a column-like shape. As regards the size, they have a diameter (not less than 1 mm) to provide a sufficiently large rigidity as compared with the support rigidity of the first protrusions. The height (depth) is not less than 0.5 mm to provide a vacuum path. The second protrusions 26b are employed mainly to secure the space and to reduce the overall evacuation resistance which may be degraded by decreasing the height of the first protrusions 26a. Thus, the shape of the second protrusions 26b is not limited to the one used in this embodiment. For example, a wider protrusion may be used as a second protrusion 26b to support a plurality of first protrusions 26a. The second protrusions 26b may be omitted but, on that occasion, preferably groove means 26c for a vacuum path such as shown in FIG. 10 may be formed appropriately in the spacing between the first protrusions 26a.

In FIG. 9, the height of the first flange 4 is so determined that, as the substrate is pressed thereto by vacuum attraction, the first flange flexes by substantially the same flexure amount (to substantially the same height) as that of the column-like protrusions 26a around it. In this embodiment, the effective load area A of the flange 4 is kept constant, the width of the flange is set to about 0.2 mm, and the height h of the flange is made larger than the protrusions 26a around it, whereby correspondence of the flexure amount is secured. As an alternative, the height of the flange may be kept equal to that of the protrusion and, by making the width of the flange smaller than the protrusions around it, the effective load area of the flange may be changed, to provide correspondence of the flexure amount. A similar effect is attainable on that occasion. Namely, if there is such a correlation between the flange and the protrusions with respect to height or width that assures substantially the same flexure to the flange and the protrusions due to a compressive force at the time of substrate attraction, it is possible to reduce local swelling of the substrate in the neighborhood of the flange.

If the amount of flexure of the protrusion is δ, the effective height of it is h, and the effective load area of it is A, then generally the following equation applies:

$$\delta k \cdot h/A$$

where k a constant which is determined by Young's modulus and the, compressive force due to vacuum attraction, shape correction coefficient, and the like. In order to assure the same flexure amount to the flange and the protrusions around it, the height h or the effective load area A of the flange may be so determined as to make h/A of the flange and h/A of the protrusions substantially equal to each other.

Figure 17A:
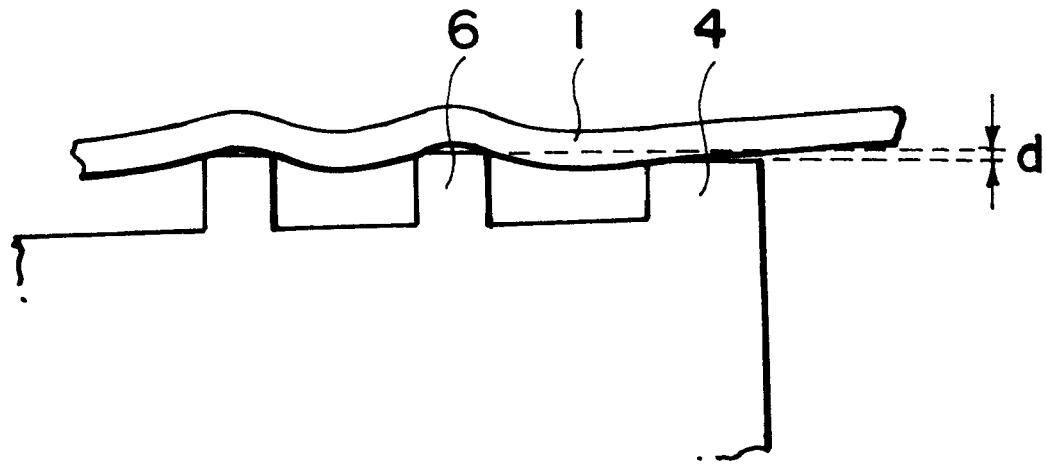
FIGS. 17A and 17B are schematic views, respectively, for explaining further embodiments of a wafer chuck according to the present invention.
Figure 17B:
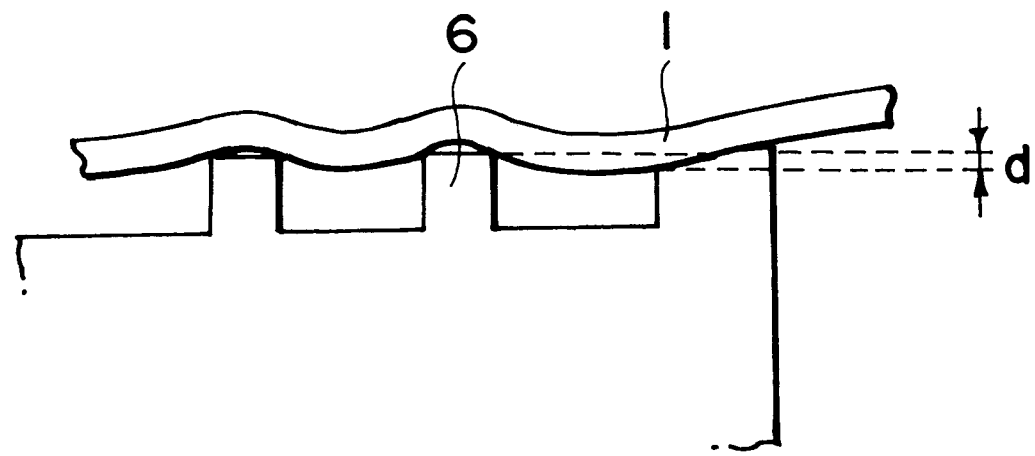

FIGS. 17A and 17B show further embodiments. In the example of FIG. 17A, the height of an annular protrusion 4 is made slightly smaller, by a predetermined amount d (0.01–0.6 microns), than the height of protrusions 6 which are distributed around it. Alternatively, as shown in FIG. 17B, the top surface of the annular protrusion 4 may be formed with a slant, inclined downwardly toward the outer side of the ring, such that the outer periphery of the annular protrusion 4 may be lower than the protrusions 6 around it. A further alternative may be that the annular protrusion may be provided by a double-ring structure having concentric annular rings, wherein the outer ring may be lower than the inner ring. In any of these structures, a local change in shape (swelling) of the wafer in the neighborhood of the annular protrusion 4 as the wafer 1 is attracted by negative pressure, can be effectively reduced.

Here, the height of the annular protrusion 4 may be so determined that a small gap is defined between the top face of the annular protrusion 4 and the wafer 1 as the wafer 1 is chucked. On that occasion, due to a pressure difference, the outside air will flow into the vacuum space on the chuck surface, from the throughbore and through this gap. However, by making the flow rate coefficient of the vacuum source upon the chuck surface sufficiently large (e.g., three times) as compared with the flow rate coefficient of such an air flow, it is possible to secure a sufficient vacuum space to the chucking of the wafer. On that occasion, there is an additional advantage that the wafer whose temperature will rise due to the exposure process can be gas-cooled, from the bottom surface thereof.

FIG. 11 is a top plan view of a chuck according to a further embodiment of the present invention, wherein the chuck is provided with a plurality of concentric annular protrusions.

In this embodiment, there are annular protrusions formed on a substrate carrying surface, which include first annular protrusions (small protrusions) 27a to be brought into contact with a substrate, and second annular protrusions 27b for supporting the first annular protrusions. The first annular protrusions 27a have a width of 0.2 mm or less. This makes the flexure of the first annular protrusions small and, on the other hand, secures a vacuum path of sufficiently small evacuation resistance.

Next, an embodiment of a device manufacturing method which uses an exposure apparatus such as described above, will be explained.

Figure 12:
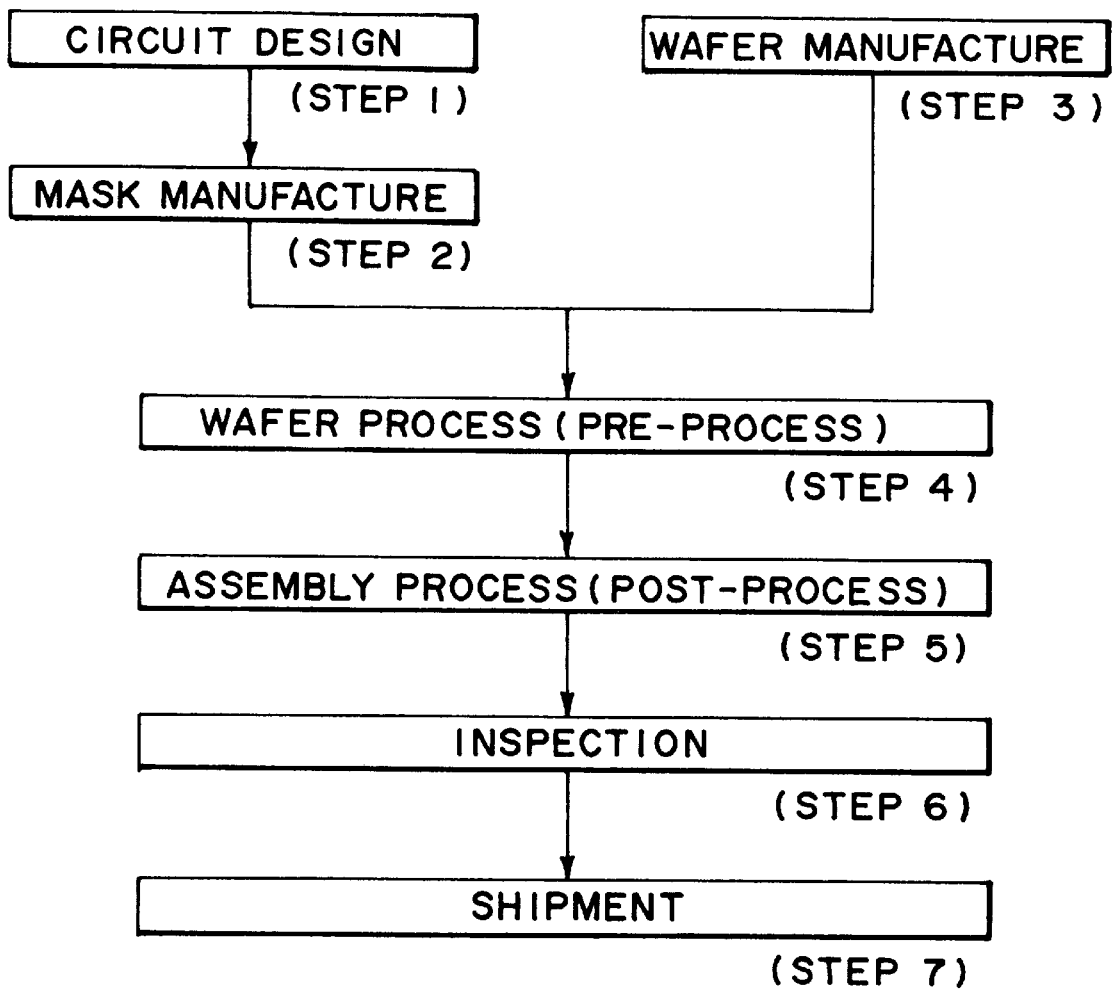
FIG. 12 is a flow chart of device manufacturing processes.
Figure 14:
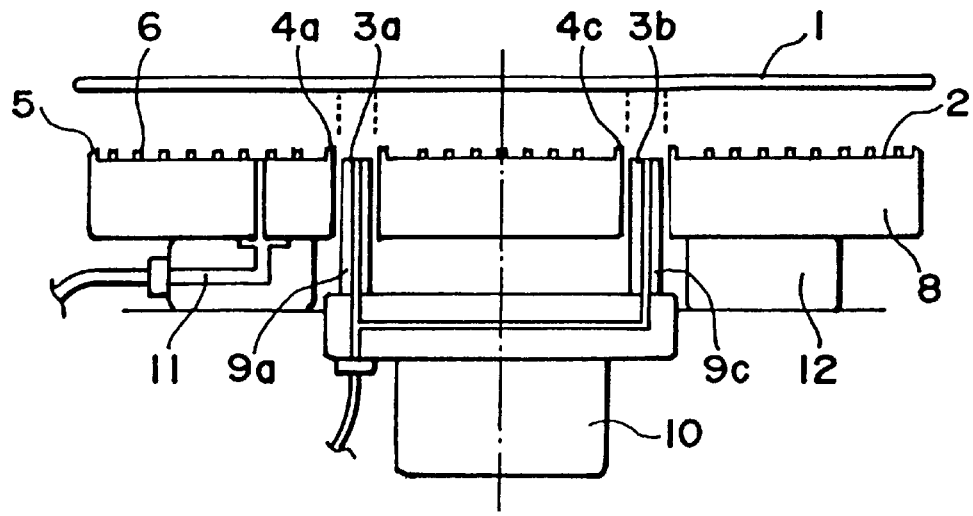
FIG. 14 is a sectional view of a known type of wafer chuck.
Figure 15:
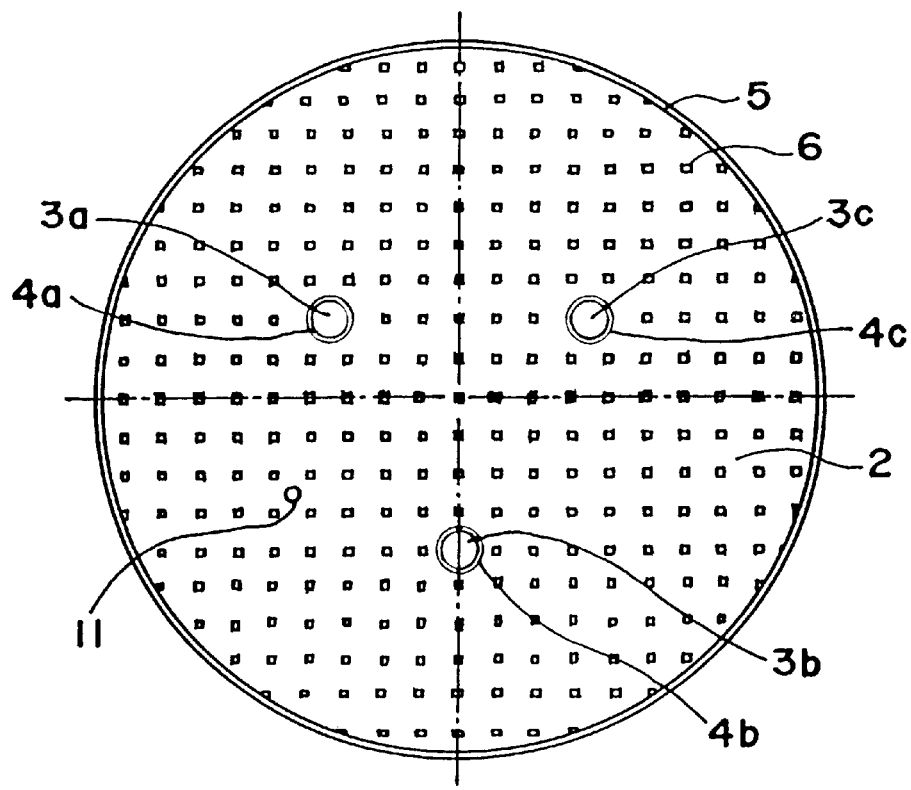
FIG. 15 is a top plan view of the wafer chuck of FIG. 14.
Figure 16:
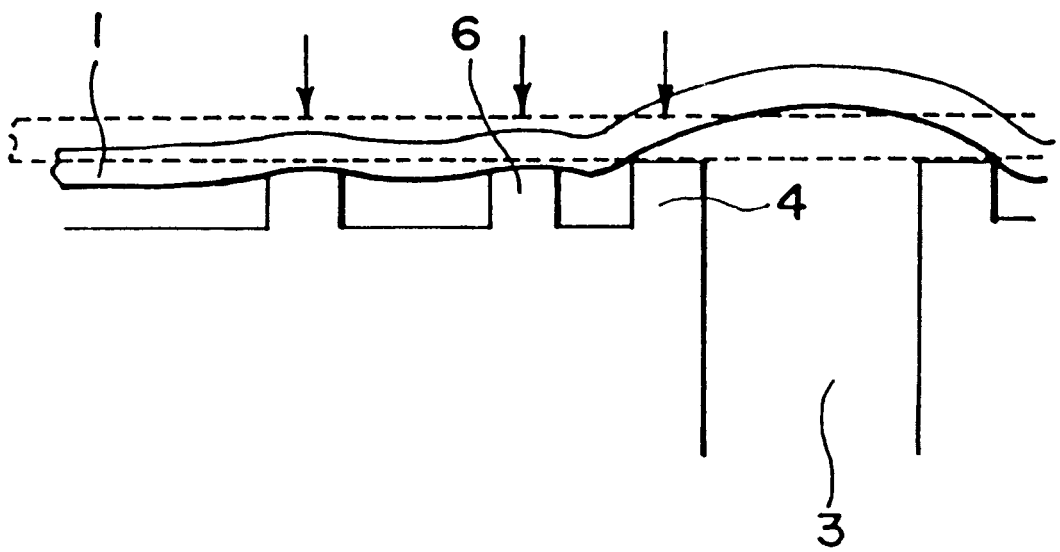
FIG. 16 is a schematic view for explaining a change in shape of a wafer, in the neighborhood of a throughbore, as the wafer is held by attraction.

FIG. 12 is a flow chart of a procedure for the manufacture of microdevices such as semiconductor chips (e.g., ICs or LSIs), liquid crystal panels, CCDs, thin film magnetic heads or micro-machines, for example. Step 1 is a design process for designing a circuit of a semiconductor device. Step 2 is a process for making a mask on the basis of the circuit pattern design. Step 3 is a process for preparing a wafer by using a material such as silicon. Step 4 is a wafer process which is called a pre-process wherein, by using the so prepared mask and wafer, circuits are practically formed on the wafer through lithography. Step 5 subsequent to this is an assembling step which is called a post-process wherein the wafer having been processed by step 4 is formed into semiconductor chips. This step includes an assembling (dicing and bonding) process and a packaging (chip sealing) process. Step 6 is an inspection step wherein an operation check, a durability check and so on for the semiconductor devices provided by step 5, are carried out. With these processes, semiconductor devices are completed and they are shipped (step 7).

FIG. 13 is a flow chart showing details of the wafer process. Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

With these processes, high density microdevices can be manufactured.

In accordance with the present invention as described hereinbefore, any local change in shape of a substrate attracted can be reduced. Thus, flatness of the attracted substrate is improved and image distortion is surely suppressed. Performing the exposure process to a substrate attracted by the substrate attracting and holding system ensures production of higher precision devices.

While the invention has been described with reference to the structures disclosed herein, it is not confined to the details set forth and this application is intended to cover such modifications or changes as may come within the purposes of the improvements or the scope of the following claims.

What is claimed is:

1. A substrate holding system for holding a substrate by attraction through a negative pressure, comprising:
   protrusions for supporting the substrate, including a primary protrusion of annular shape disposed around a substrate lifting pin and secondary protrusions distributed around said primary protrusion; and
   means for reducing a local change in shape of the substrate in a portion around said primary protrusion as the substrate is attracted by the negative pressure,
   wherein said reducing means comprises a protrusion support formed with a pattern that serves to gradually reduce support rigidity per unit area for attraction of the substrate, radially outwardly from said primary protrusion.

2. A system according to claim 1, wherein said protrusion support includes a linear protrusion extending in a direction radially outwardly from said primary protrusion.

3. A system according to claim 1, wherein said protrusion support includes protrusions distributed with a density which decreases with a distance from said primary protrusion.

4. A system according to claim 1, further comprising a third protrusion of rim-like shape formed at the outermost circumference of said secondary protrusions.

5. A substrate holding system for holding a substrate by attraction through a negative pressure, comprising:
   protrusions for supporting the substrate, including a primary protrusion of annular shape disposed around a substrate lifting pin and secondary protrusions having a column-like shape and distributed around said primary protrusion; and
   means for reducing a local change in shape of the substrate in a portion around said primary protrusion as the substrate is attracted by the negative pressure,
   wherein said reducing means comprises small protrusions which are defined at free ends of said secondary protrusions, respectively.

6. A system according to claim 5, wherein said small protrusions have one of a column-like shape, a conical shape, a polygonal-rod shape, a pyramid shape, and a semi-spherical shape.

7. A system according to claim 5, wherein said secondary protrusions comprise a plurality of concentric annular protrusions.

8. A substrate holding system for holding a substrate by attraction through a negative pressure, comprising:
   protrusions for supporting the substrate, including a primary protrusion of annular shape disposed around a substrate lifting pin and secondary protrusions distributed around said primary protrusion; and
   means for reducing a local change in shape of the substrate in a portion around said primary protrusion as the substrate is attracted by the negative pressure,
   wherein said reducing means serves to make compression flexure of said primary protrusion and compression flexure of said secondary protrusions, as the substrate is attracted, substantially equal to each other.

9. A system according to claim 8, wherein, when the effective height is h and the effective load area is A, a value h/A of said primary protrusion and a value h/A of said secondary protrusions are substantially equal to each other.

10. A substrate holding system for holding a substrate by attraction through a negative pressure, comprising:
    protrusions for supporting the substrate, including a primary protrusion of annular shape disposed around a substrate lifting pin and secondary protrusions distributed around said primary protrusion;
    means for reducing a local change in shape of the substrate in a portion around said primary protrusion as the substrate is attracted by the negative pressure; and
    a third protrusion of rim-like shape formed at the outermost circumference of said secondary protrusions, and
    wherein said third protrusion has an annular shape.

11. A substrate holding system for holding a substrate by attraction through a negative pressure, comprising:
    protrusions for supporting the substrate, including a primary protrusion of annular shape disposed around a substrate lifting pin and secondary protrusions distributed around said primary protrusion; and
    means for reducing a local change in shape of the substrate in a portion around said primary protrusion as the substrate is attracted by the negative pressure,
    wherein there are three lifting pins.

12. A substrate holding system for holding a substrate by attraction through a negative pressure, comprising:
    protrusions for supporting the substrate, including a primary protrusion of annular shape disposed around a substrate lifting pin and secondary protrusions distributed around said primary protrusion; and
    means for reducing a local change in shape of the substrate in a portion around said primary protrusion as the substrate is attracted by the negative pressure,
    wherein an opening for supply of vacuum for substrate attraction is formed at a free end of said lifting pin.

13. An exposure apparatus, comprising,
    a substrate holding system for holding a substrate by attraction through a negative pressure, comprising:
    protrusions for supporting the substrate, including a primary protrusion of annular shape disposed around a substrate lifting pin and secondary protrusions distributed around said primary protrusion; and
    means for reducing a local change in shape of the substrate in a portion around said primary protrusion as the substrate is attracted by the negative pressure,
    wherein said reducing means comprises a protrusion support formed with a pattern that serves to gradually reduce support rigidity per unit area for attraction of the substrate, radially outwardly from said primary protrusion; and
    exposure means for exposing a substrate held by said substrate holding means.

14. An apparatus according to claim 13, wherein the substrate comprises a semiconductor wafer, and said exposure means serves to print a pattern on the wafer through a lithographic process.

15. A device manufacturing method which uses an exposure apparatus comprising:
    a substrate holding system for holding a substrate by attraction through a negative pressure, comprising:
    protrusions for supporting the substrate, including a primary protrusion of annular shape disposed around a substrate lifting pin and secondary protrusions distributed around said primary protrusion; and
    means for reducing a local change in shape of the substrate in a portion around said primary protrusion as the substrate is attracted by the negative pressure,
    wherein said reducing means comprises a protrusion support formed with a pattern that serves to gradually reduce support rigidity per unit area for attraction of the substrate, radially outwardly from said primary protrusion; and exposure means for exposing a substrate held by said substrate holding means, wherein the substrate comprises a semiconductor wafer, and said exposure means serves to print a pattern on the wafer through a lithographic process.

16. A substrate holding system for holding a substrate by attraction through a negative pressure, comprising:

protrusions for supporting the substrate, including a primary protrusion of annular shape disposed around a substrate lifting pin and secondary protrusions distributed around said primary protrusion; and means for reducing a local change in shape of the substrate in a portion around said primary protrusion as the substrate is attracted by the negative pressure, wherein said reducing means functions in the point that the height of said primary protrusion is lower than that of said secondary protrusions.

17. A system according to claim 16, wherein the height of said primary protrusion is so determined that a clearance is defined between the top face of said primary protrusion and the substrate as the substrate is attracted.

18. A substrate holding system for holding a substrate by attraction through a negative pressure, comprising:

protrusions for supporting the substrate, including a primary protrusion of annular shape disposed around a substrate lifting pin and secondary protrusions distributed around said primary protrusion; and means for reducing a local change in shape of the substrate in a portion around said primary protrusion as the substrate is attracted by the negative pressure, wherein said reducing means functions in the point that the top face of said primary protrusion has a slant.

19. A substrate holding system for holding a substrate by attraction through a negative pressure, said system comprising:

a plurality of protrusions for supporting the substrate, said protrusions including a primary protrusion of annular shape disposed around a substrate lifting pin and secondary protrusions distributed around said primary protrusion; and a protrusion support having a pattern that gradually reduces support rigidity per unit area for attraction of the substrate, radially outwardly from said primary protrusion.

20. A system according to claim 19, wherein said protrusion support includes a linear protrusion extending in a direction radially outwardly from said primary protrusion.

21. A system according to claim 19, wherein said protrusion support includes protrusions distributed with a density which decreases with a distance from said primary protrusion.

22. A substrate holding system for holding a substrate by attraction through a negative pressure, said system comprising:

a plurality of protrusions for supporting the substrate, said protrusions including a primary protrusion of annular shape disposed around a substrate lifting pin and secondary protrusions having a column-like shape and distributed around said primary protrusion; and small protrusions defined at free ends of said secondary protrusions, respectively, wherein said small protrusions have one of a column-like shape, a conical shape, a polygonal-rod shape, a pyramid shape, and a semi-spherical shape.

23. A substrate holding system for holding a substrate by attraction through a negative pressure, said system comprising:

a plurality of protrusions for supporting the substrate, said protrusions including a primary protrusion of annular shape disposed around a substrate lifting pin and secondary protrusions distributed around said primary protrusion, wherein compression flexure of said primary protrusion and compression flexure of said secondary protrusions, as the substrate is attracted, are substantially equal to each other.

24. A substrate holding system for holding a substrate by attraction through a negative pressure, said system comprising:

a plurality of protrusions for supporting the substrate, said protrusions including a primary protrusion of annular shape disposed around a substrate lifting pin and secondary protrusions distributed around said primary protrusion, wherein the height of said primary protrusion is less than that of said secondary protrusions.

25. A substrate holding system for holding a substrate by attraction through a negative pressure, said system comprising:

a plurality of protrusions for supporting the substrate, said protrusions including a primary protrusion of annular shape disposed around a substrate lifting pin and secondary protrusions distributed around said primary protrusion, wherein the top face of said primary protrusion has a slant.

* * * * *

UNITED STATES PATENT AND TRADEMARK OFFICE
CERTIFICATE OF CORRECTION

PATENT NO. : 5,923,408

DATED : July 13, 1999

INVENTOR(S): YUKIO TAKABAYASHI

It is certified that error appears in the above-identified patent and that said Letters Patent is hereby corrected as shown below:

IN THE DRAWINGS

FIGURE 13,
In Step 13, "ELCTRODE" should read --ELECTRODE--.

IN THE DISCLOSURE

COLUMN 1,
Line 58, "plane-view" should read --plan view--.

COLUMN 2,
Line 31, "attributes to" should read --is attributed to--.

COLUMN 6,
Line 49, "ceramic-thin" should read --ceramic thin--

UNITED STATES PATENT AND TRADEMARK OFFICE
CERTIFICATE OF CORRECTION

PATENT NO. : 5,923,408

DATED : July 13, 1999

INVENTOR(S): YUKIO TAKABAYASHI

It is certified that error appears in the above-identified patent and that said Letters Patent is hereby corrected as shown below:

<u>COLUMN 7</u>,
Line 29, "δk·h/A" should read --∝k·h/A--;
Line 30, "k" should read --k is--; and "modulus" should read modulus,--; and
Line 31, "the," should read --the--.

Signed and Sealed this

Thirtieth Day of May, 2000

Attest:

Q. TODD DICKINSON

*Attesting Officer*   *Director of Patents and Trademarks*